United States Patent
Lee et al.

(10) Patent No.: US 11,646,082 B2
(45) Date of Patent: May 9, 2023

(54) SEMICONDUCTOR MEMORY DEVICE RELATED TO REDUCING PROGRAM DISTURB AND METHOD OF OPERATING THE SEMICONDUCTOR MEMORY DEVICE

(71) Applicant: SK hynix Inc., Icheon-si (KR)

(72) Inventors: Hee Youl Lee, Icheon-si (KR); Jeong Su Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/393,142

(22) Filed: Aug. 3, 2021

(65) Prior Publication Data

US 2022/0270685 A1    Aug. 25, 2022

(30) Foreign Application Priority Data

Feb. 25, 2021    (KR) .................. 10-2021-0025923

(51) Int. Cl.
G11C 16/04    (2006.01)
G11C 16/10    (2006.01)
G11C 16/34    (2006.01)

(52) U.S. Cl.
CPC .......... *G11C 16/10* (2013.01); *G11C 16/0483* (2013.01); *G11C 16/3459* (2013.01)

(58) Field of Classification Search
CPC .. G11C 16/10; G11C 16/0483; G11C 16/3459

USPC ...................................................... 365/185.22
See application file for complete search history.

(56) References Cited

U.S. PATENT DOCUMENTS

2018/0090220 A1* 3/2018 Minagawa ......... G11C 16/3459
2018/0247688 A1* 8/2018 Lee .................... G11C 16/3459

FOREIGN PATENT DOCUMENTS

KR         101635502 B1    7/2016
KR         101721005 B1    3/2017
KR       1020180099018 A    9/2018

* cited by examiner

*Primary Examiner* — Tha-O H Bui
(74) *Attorney, Agent, or Firm* — William Park & Associates Ltd.

(57) ABSTRACT

A semiconductor memory device includes a memory block, a peripheral circuit, and control logic. The memory block includes a plurality of string groups respectively connected to a corresponding source select line among a plurality of source select lines. The peripheral circuit is configured to perform a program operation of storing data within the memory block. The control logic controls the program operation of the peripheral circuit. The plurality of source select lines are grouped into a plurality of source select line groups. The control logic controls the peripheral circuit to increase a voltage of a first source select line group including a source select line connected to a selected string group to a first level among the plurality of source select line groups.

22 Claims, 18 Drawing Sheets

SEMICONDUCTOR MEMORY DEVICE RELATED TO REDUCING PROGRAM DISTURB AND METHOD OF OPERATING THE SEMICONDUCTOR MEMORY DEVICE

CROSS-REFERENCE TO RELATED APPLICATION

The present application claims priority under 35 U.S.C. § 119(a) to Korean patent application number 10-2021-0025923, filed on Feb. 25, 2021, in the Korean Intellectual Property Office, the entire disclosure of which is incorporated herein by reference.

BACKGROUND

1. Technical Field

The present disclosure relates to an electronic device, and more particularly, to a semiconductor memory device and a method of operating the semiconductor memory device.

2. Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional memory device is a memory device designed in order to resolve a limit of integration degree of a two-dimensional semiconductor memory device, and may include a plurality of memory cells that are vertically stacked on a semiconductor substrate.

SUMMARY

According to an embodiment of the present disclosure, a semiconductor memory device may include a memory block, a peripheral circuit, and a control logic. The memory block may include a plurality of string groups respectively connected to a corresponding source select line among a plurality of source select lines. The peripheral circuit may be configured to perform a program operation of storing data within the memory block. The control logic may control the program operation of the peripheral circuit. The plurality of source select lines may be grouped into a plurality of source select line groups. The control logic may control the peripheral circuit to increase a voltage of a first source select line group including a source select line connected to a selected string group among the plurality of source select line groups to a first level.

According to another embodiment of the present disclosure, a program operation on a memory block that may include first to N-th (N is a natural number greater than or equal to 3) string groups may be performed by a method of operating a semiconductor memory device. The program operation may include a plurality of program loops. Each of the plurality of program loops may include a precharge phase and a verify phase. The verify phase may include increasing a voltage of a first source select line connected to the first string group selected as a program target among the first to N-th string groups and a second source select line connected to the second string group to a first level.

DETAILED DESCRIPTION

Figure 1:
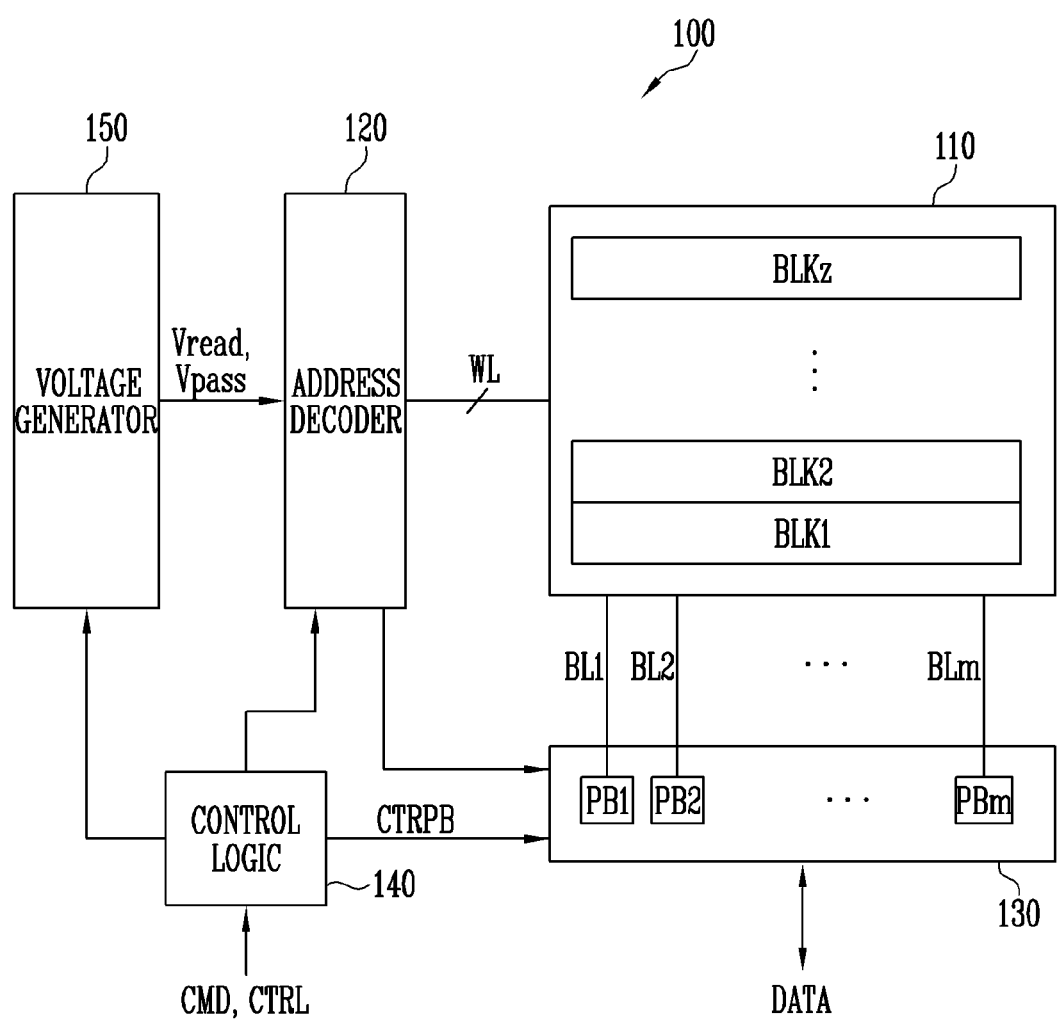
FIG. 1 is a block diagram illustrating a semiconductor memory device according to an embodiment of the present disclosure.

Specific structural or functional descriptions of embodiments which are disclosed in the present specification or application are illustrated only to describe the embodiments according to the present disclosure. The embodiments according to the present disclosure may be carried out in various forms and should not be construed as being limited to the embodiments described in the present specification or application.

In the description of the present disclosure, the terms "first" and "second" may be used to describe various components, but the components are not limited by the terms. The terms may be used to distinguish one component from another component. For example, a first component may be called a second component and a second component may be called a first component without departing from the scope of the present disclosure.

An embodiment of the present disclosure provides a semiconductor memory device capable of reducing program disturb and a method of operating the same.

In an embodiment, a control logic may control a peripheral circuit to decrease a voltage of a first source select line group to a second level after applying a verify voltage to a selected word line among word lines connected to a memory block, and apply a verify pass voltage to an unselected word line.

In an embodiment, the control logic may control the peripheral circuit to maintain a voltage of a second source select line group different from the first source select line group, while increasing the voltage of the first source select line group to the first level, applying the verify voltage to the selected word line among the word lines connected to the memory block, applying the verify pass voltage to the unselected word line, and decreasing the voltage of the first source select line group to the second level.

In an embodiment, the voltage of the second source select line group may be maintained at the second level.

In an embodiment, the first level may be a voltage for turning on source select transistors connected to the first source select line group, and the second level may be a ground voltage.

In an embodiment, the control logic may control the peripheral circuit to apply a precharge voltage to a common source line connected to the memory block, and to increase the voltage of the first source select line group to the first level.

In an embodiment, the control logic may control the peripheral circuit to decrease the voltage of the first source select line group to the second level after increasing the voltage of the first source select line group to the first level.

In an embodiment, the control logic may control the peripheral circuit to maintain a voltage of a second source select line group different from the first source select line group, while applying the precharge voltage to the common source line connected to the memory block, increasing the voltage of the first source select line group to the first level, and decreasing the voltage of the first source select line group to the second level.

In an embodiment, the memory block may include first to fourth string groups, the selected string group may correspond to the first string group, the first source select line group may include first and second source select lines connected to the first and second string groups, respectively, and the second source select line group may include third and fourth source select lines connected to the third and fourth string groups, respectively.

In an embodiment, the control logic may control the peripheral circuit to apply a precharge voltage to a common source line connected to the memory block, after applying the verify voltage to the selected word line among the word lines connected to the memory block and applying the verify pass voltage to the unselected word line.

In an embodiment, the control logic may control the peripheral circuit to decrease the voltage of the first source select line group to a second level after applying the precharge voltage to the common source line.

In an embodiment, source select lines belonging to the first source select line group may be electrically connected to each other.

In an embodiment, source select lines belonging to the second source select line group may be electrically connected to each other.

In an embodiment, the verifying step may further include decreasing the voltage of the first and second source select lines to a second level.

In an embodiment, the first level may be a voltage capable of turning on source select transistors included in the first string group and the second string group, the second level may be a ground voltage, and during the verify phase, a voltage of a third source select line connected to the third string group among the first to N-th string groups and a fourth source select line connected to the fourth string group among the first to N-th string groups may be maintained at the second level.

In an embodiment, the precharge phase may include applying a precharge voltage to a common source line connected to the memory block, and increasing the voltage of the first and second source select lines to the first level.

In an embodiment, the voltage of the third and fourth source select lines may be maintained at the second level during the precharge phase.

In an embodiment, the precharge phase may include applying a precharge voltage to a common source line connected to the memory block, and decreasing the voltage of the first and second source select lines to a second level.

In an embodiment, the first source select line and the second source select line may be electrically connected to each other, and the third source select line and the fourth source select line may be electrically connected to each other.

The present technology may provide a semiconductor memory device capable of reducing program disturb and a method of operating the semiconductor memory device.

FIG. 1 is a block diagram illustrating a semiconductor memory device according to an embodiment of the present disclosure.

Referring to FIG. 1, the semiconductor memory device 100 includes a memory cell array 110, an address decoder 120, a read and write circuit 130, control logic 140, and a voltage generator 150. The control logic 140 may be implemented as hardware, software, or a combination of hardware and software. For example, the control logic 140 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. As an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Meanwhile, each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell storing three bits of data. In still another embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120, the read and write circuit 130, the control logic 140, and the voltage generator 150 operate as a peripheral circuit that drives the memory cell array 110. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated in the voltage generator 150 to a selected word line of the selected memory block at a time of a read voltage application operation during a read operation, and applies a pass voltage Vpass to the remaining unselected word lines. In addition, during a program verify operation, the address decoder 120 applies a verify voltage generated in the voltage generator 150 to the selected word line of the selected memory block, and applies the pass voltage Vpass to the remaining unselected word lines.

The address decoder 120 is configured to decode a column address of the received addresses. The address decoder 120 transmits the decoded column address to the read and write circuit 130.

A read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense threshold voltages of the memory cells, the plurality of page buffers PB1 to PBm sense a change of an amount of a current flowing according to a program state of a corresponding memory cell through a sensing node while continuously supplying a sensing current to a corresponding bit line connected to the memory cell, and latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the semiconductor memory device 100. As an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. In addition, the control logic 140 outputs a control signal for adjusting a sensing node pre-charge potential level of the plurality of page buffers PB1 to PBm. The control logic 140 may control the read and write circuit 130 to perform the read operation of the memory cell array 110.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140.

The address decoder 120, the read and write circuit 130, and the voltage generator 150 may function as a "peripheral circuit" that performs a read operation, a write operation, and an erase operation on the memory cell array 110. The peripheral circuit performs the read operation, the write operation, and the erase operation on the memory cell array 110 based on the control of the control logic 140.

Figure 2:
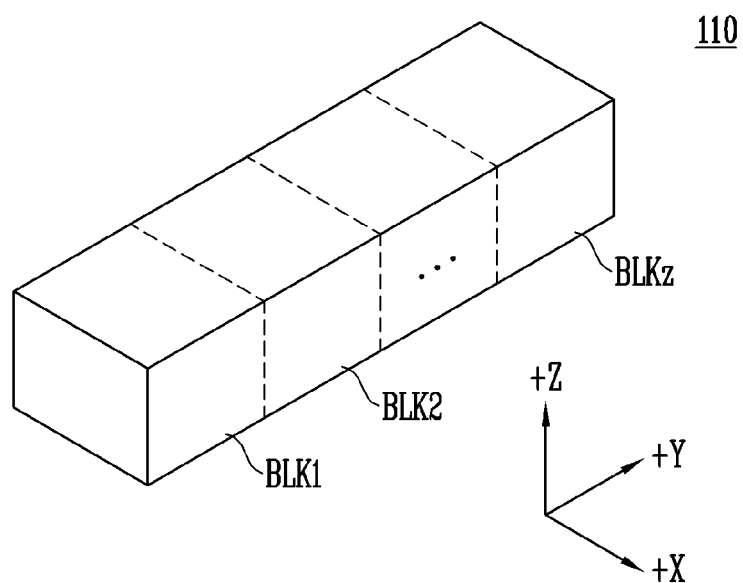
FIG. 2 is a diagram illustrating an embodiment of a memory cell array of FIG. 1.

FIG. 2 is a diagram illustrating an embodiment of the memory cell array of FIG. 1.

Referring to FIG. 2, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described more with reference to FIGS. 3 and 4.

Figure 3:
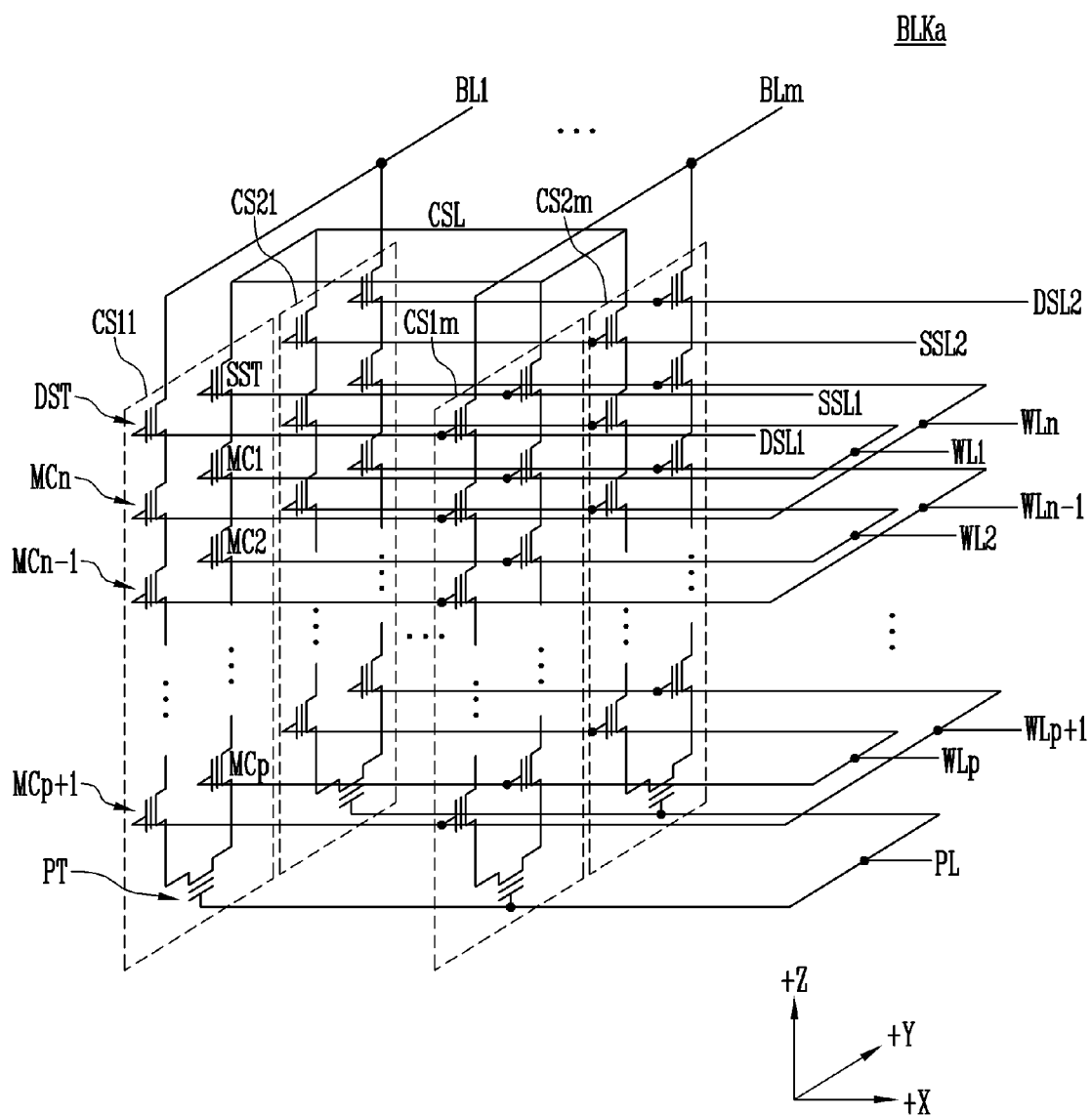
FIG. 3 is a circuit diagram illustrating any one memory block BLKa of memory blocks BLK1 to BLKz of FIG. 2.

FIG. 3 is a circuit diagram illustrating any one memory block BLKa of the memory blocks BLK1 to BLKz of FIG. 2.

Referring to FIG. 3, the memory block BLKa includes a plurality of cell strings CS11 to CS1$m$ and CS21 to CS2$m$. As an embodiment, each of the plurality of cell strings CS11 to CS1$m$ and CS21 to CS2$m$ may be formed in a 'U' shape. In the memory block BLKa, m cell strings are arranged in a row direction (that is, the +X direction). In FIG. 3, two cell strings are arranged in a column direction (that is, the +Y direction). However, this is for convenience of description and it may be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layers, the tunneling insulating film, the charge storage film, and the blocking insulating film may be provided in each cell string.

The source select transistor SST of each cell string is connected between a common source line CSL and the memory cells MC1 to MCp.

As an embodiment, the source select transistors of the cell strings arranged in the same row are connected to a source select line extending in the row direction, and the source select transistors of the cell strings arranged in different rows are connected to different source select lines. In FIG. 3, the source select transistors of the cell strings CS11 to CS1$m$ of a first row are connected to a first source select line SSL1. The source select transistors of the cell strings CS21 to CS2$m$ of a second row are connected to a second source select line SSL2.

As another embodiment, the source select transistors of the cell strings CS11 to CS1$m$ and CS21 to CS2$m$ may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1$m$ of the first row are connected to a first drain select line DSL1. The drain select transistors of the cell strings CS21 to CS2$m$ of the second row are connected to a second drain select line DSL2.

The cell strings arranged in the column direction are connected to the bit lines extending in the column direction. In FIG. 3, the cell strings CS11 and CS21 of the first column are connected to the first bit line BL1. The cell strings CS1$m$ and CS2$m$ of the m-th column are connected to the m-th bit line BL$m$.

The memory cells connected to the same word line in the cell strings arranged in the row direction configure one page. For example, the memory cells connected to the first word line WL1, among the cell strings CS11 to CS1$m$ of the first row configure one page. The memory cells connected to the first word line WL1, among the cell strings CS21 to CS2$m$ of the second row configure another page. The cell strings arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BL$m$. In addition, even-numbered cell strings among the cell strings CS11 to CS1$m$ or CS21 to CS2$m$ arranged in the row direction may be connected to the even bit lines, and odd-numbered cell strings among the cell strings CS11 to CS1$m$ or CS21 to CS2$m$ arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less dummy memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 4:
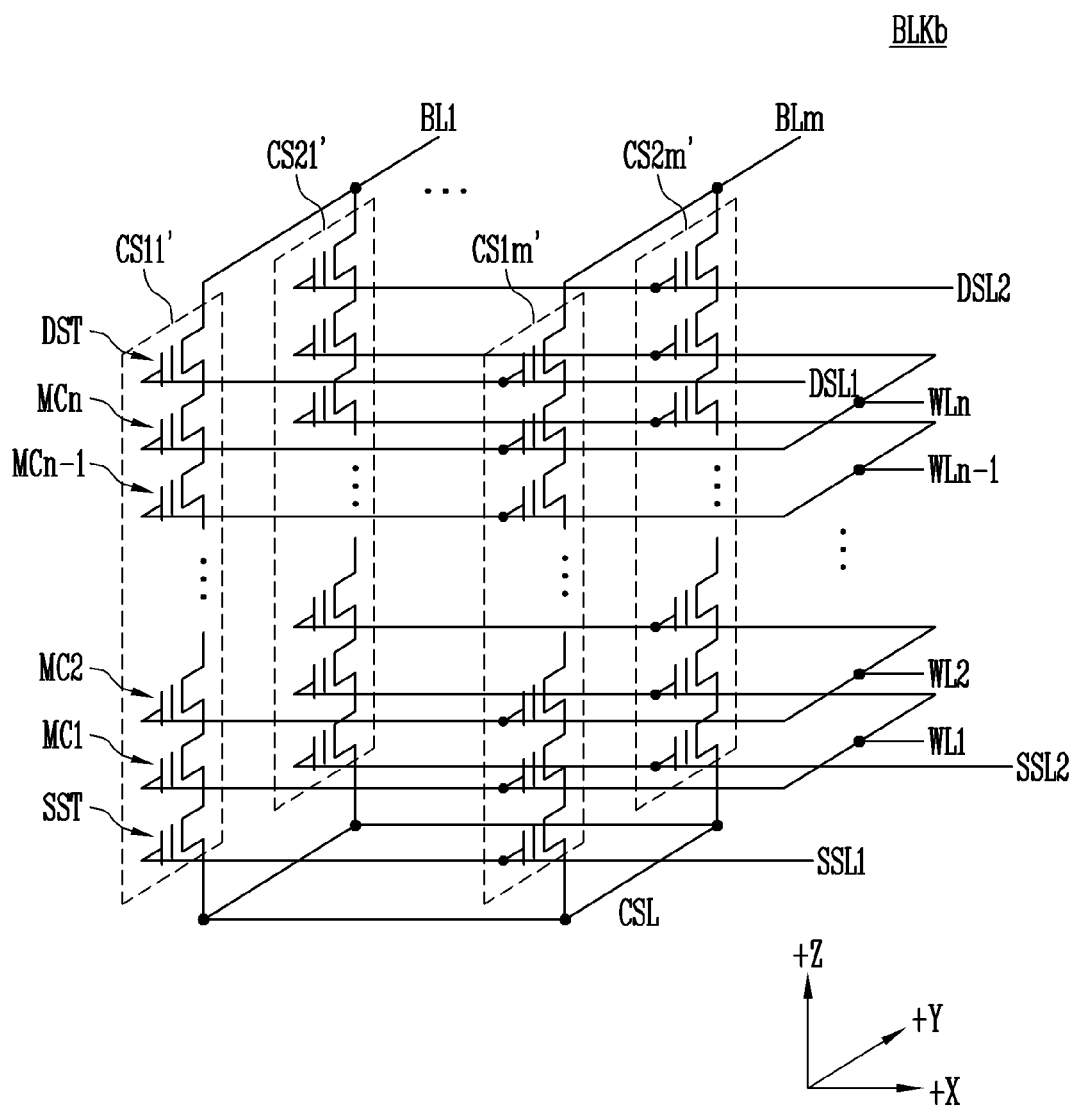
FIG. 4 is a circuit diagram illustrating another embodiment of any one memory block BLKb of the memory blocks BLK1 to BLKz of FIG. 2.

FIG. 4 is a circuit diagram illustrating another embodiment of any one memory block BLKb of the memory blocks BLK1 to BLKz of FIG. 2.

Referring to FIG. 4, the memory block BLKb includes a plurality of cell strings CS11' to CS1$m$' and CS21' to CS2$m$'. Each of the plurality of cell strings CS11' to CS1$m$' and CS21' to CS2$m$' extends along a +Z direction. Each of the plurality of cell strings CS11' to CS1$m$' and CS21' to CS2$m$' includes at least one source select transistor SST, first to n-th memory cells MC1 to MCn, and at least one drain select transistor DST stacked on a substrate (not shown) under the memory block BLKb.

The source select transistor SST of each cell string is connected between a common source line CSL and memory cells MC1 to MCn. The source select transistors of the cell strings arranged in the same row are connected to the same source select line. The source select transistors of the cell strings CS11' to CS1$m$' arranged in a first row are connected to a first source select line SSL1. The source select transistors of the cell strings CS21' to CS2$m$' arranged in a second row are connected to a second source select line SSL2. As another embodiment, the source select transistors of the cell strings CS11' to CS1$m$' and CS21' to CS2$m$' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1$m$' of a first row are connected to a first drain select line DSL1. The drain select transistors of the cell strings CS21' to CS2m' of a second row are connected to a second drain select line DSL2.

As a result, the memory block BLKb of FIG. 4 has an equivalent circuit similar to that of the memory block BLKa of FIG. 3 except that the pipe transistor PT is excluded from each cell string.

As another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less dummy memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 5:
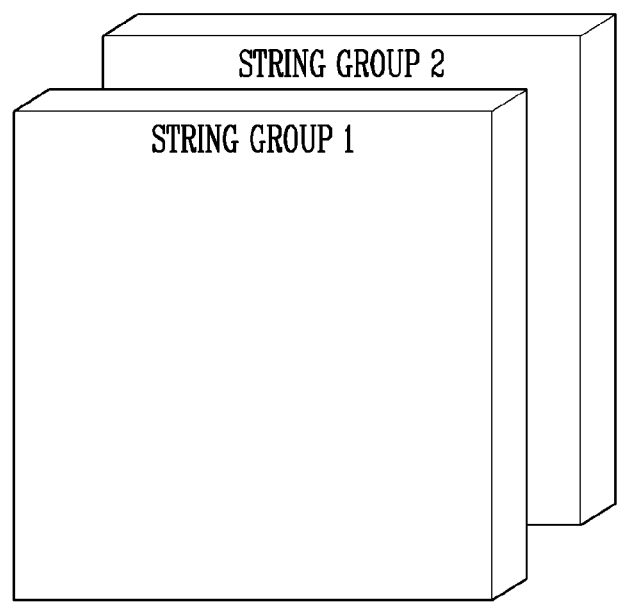
FIG. 5 is a diagram illustrating an example of a string group configuring a memory block.
Figure 5:
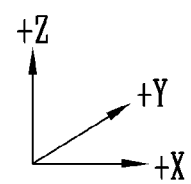

FIG. 5 is a diagram illustrating an example of a string group configuring a memory block.

Referring to FIG. 5, string groups STRING GROUP 1 and STRING GROUP 2 included in the memory blocks BLKa and BLKb shown in FIG. 3 or 4 are shown. For example, referring to FIG. 3 together, the string group included in the memory block BLKa may be defined as cell strings that share the drain select line or the source select line. For example, in FIG. 3, the cell strings CS11 to CS1m sharing the first drain select line DSL1 and the first source select line SSL1 may configure the first string group STRING GROUP 1. Meanwhile, the cell strings CS21 to CS2m sharing the second drain select line DSL2 and the second source select line SSL2 may configure the second string group STRING GROUP 2.

As another example, in FIG. 4, the cell strings CS11' to CS1m' sharing the first drain select line DSL1 and the first source select line SSL1 may configure the first string group STRING GROUP 1. Meanwhile, the cell strings CS21' to CS2m' sharing the second drain select line DSL2 and the second source select line SSL2 may configure the second string group STRING GROUP 2. The memory block includes the two string groups STRING GROUP 1 and STRING GROUP 2 arranged in the +Y direction. Each of the string groups STRING GROUP 1 and STRING GROUP 2 includes the cell strings arranged in the row direction (that is, the +X direction). Meanwhile, each of the string groups STRING GROUP 1 and STRING GROUP 2 includes pages arranged in a string direction (that is, the +Z direction). A configuration of each string group is described later with reference to FIGS. 6A and 6B.

Figure 6A:
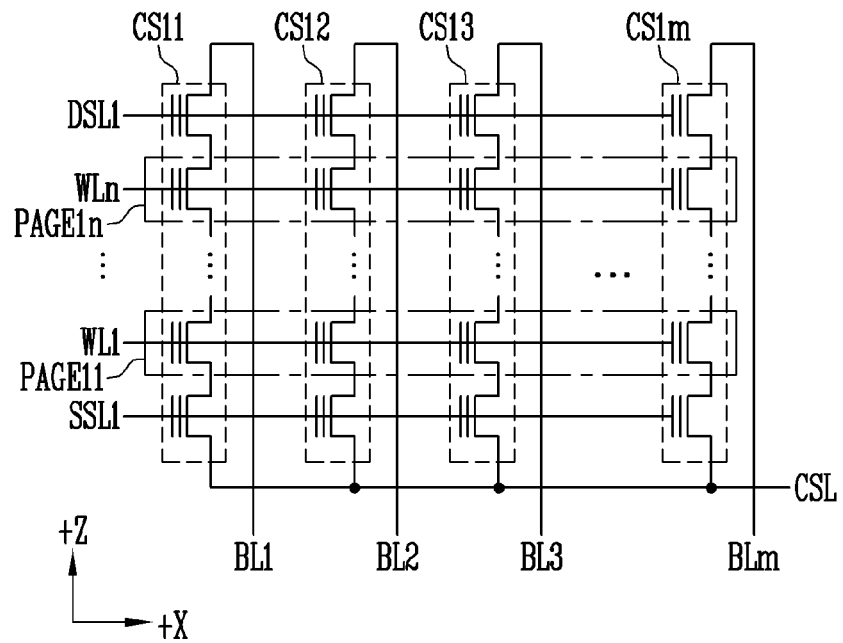
FIG. 6A is a circuit diagram illustrating a first string group among string groups shown in FIG. 5.

FIG. 6A is a circuit diagram illustrating the first string group among the string groups shown in FIG. 5. Since the second string group may also be configured identically to the first string group, a detailed circuit diagram of the second string group is omitted.

Referring to FIG. 6A, the first string group STRING GROUP 1 includes the cell strings CS11 to CS1m sharing the first drain select line DSL1 and the first source select line SSL1. That is, the cell strings CS11 to CS1m included in the first string group STRING GROUP 1 are commonly connected to the first drain select line DSL1 and the first source select line SSL1. The cell strings CS11 to CS1m are arranged in the +X direction in the first string group STRING GROUP 1. The cell strings CS11 to CS1m are connected to the corresponding bit lines BL1 to BLm, respectively.

Meanwhile, the first string group STRING GROUP 1 includes pages PAGE11 to PAGE1n arranged in the +Z direction. Each of the pages PAGE11 to PAGE1n may be a set of memory cells connected to the corresponding word lines WL1 to WLn.

Although not shown in FIG. 6A, the second string group STRING GROUP 2 may also include the cell strings CS21 to CS2m arranged in the +X direction. Meanwhile, the second string group STRING GROUP 2 may include pages PAGE21 to PAGE2n arranged in the +Z direction.

Figure 6B:
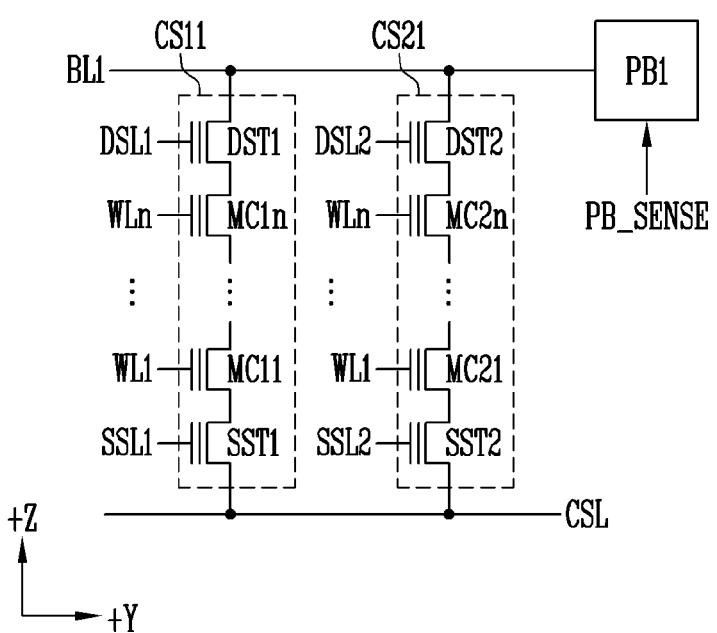
FIG. 6B is a circuit diagram illustrating a portion of a cell string included in first and second string groups.

FIG. 6B is a circuit diagram illustrating a portion of the cell string included in the first and second string groups.

Referring to FIG. 6B, the cell string CS11 included in the first string group STRING GROUP 1 and the cell string CS21 included in the second string group STRING GROUP 2 are shown. FIG. 6B may be a circuit diagram illustrating the memory block shown in FIG. 5 in the +X direction. Therefore, in FIG. 6B, the cell strings CS12 to CS1m included in the first string group STRING GROUP 1 and the cell strings CS22 to CS2m included in the second string group STRING GROUP 2 are not shown.

The cell string CS11 of the first string group STRING GROUP 1 includes the memory cells MC11 to MC1n connected between the first drain select transistor DST1 and the first source select transistor SST1. The cell string CS21 of the second string group STRING GROUP 2 includes memory cells MC21 to MC2n connected between a second drain select transistor DST2 and a second source select transistor SST2.

The cell string CS11 included in the first string group STRING GROUP 1 and the cell string CS21 included in the second string group STRING GROUP 2 are commonly connected to the bit line BL1. Meanwhile, the page buffer PB1 is commonly connected to the bit line BL1. That is, the cell string CS11 included in the first string group STRING GROUP 1 and the cell string CS21 included in the second string group STRING GROUP 2 may share the page buffer PB1.

Figure 7:
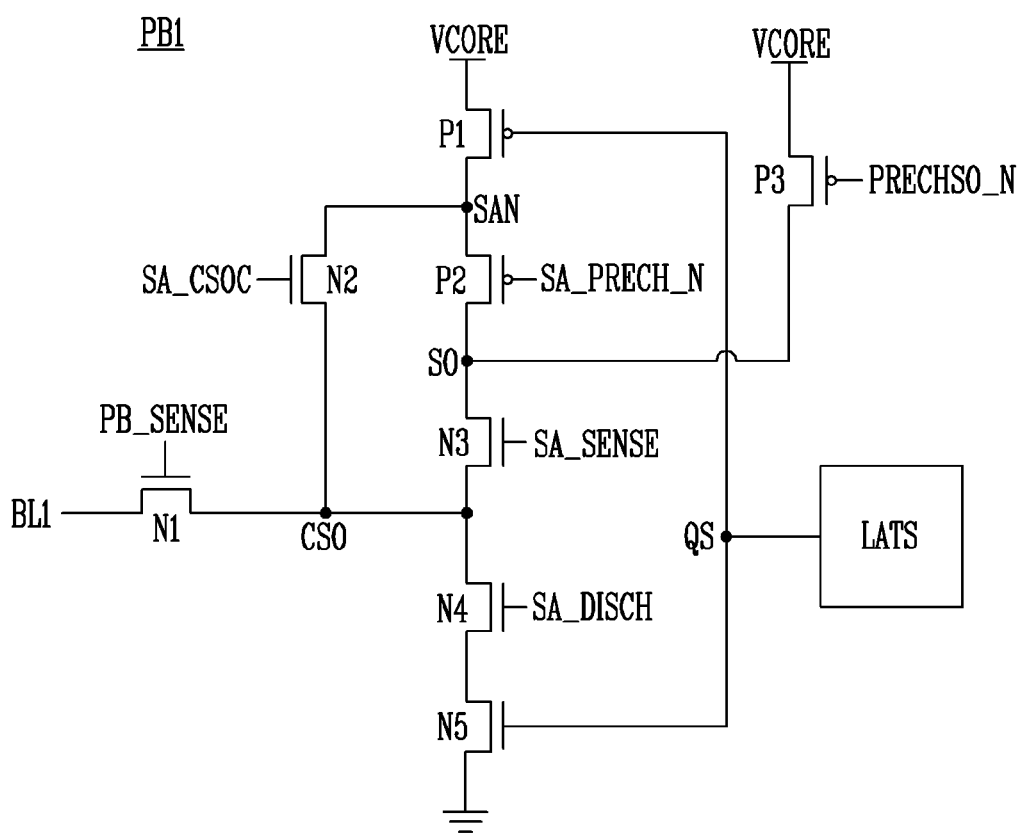
FIG. 7 is a circuit diagram illustrating a page buffer PB1 included in a semiconductor memory device 100 according to an embodiment.

FIG. 7 is a circuit diagram illustrating the page buffer PB1 included in the semiconductor memory device 100 according to an embodiment. The page buffer shown in FIG. 7 may be any one of the page buffers PB1 to PBm included in the read and write circuit 130 of FIG. 1. Since the plurality of page buffers PB1 to PBm included in the read and write circuit 130 may be configured similarly to each other, any one of the page buffers is described as an example.

The page buffer may operate in response to a signal output from the control logic 140. Signals PB_SENSE, SA_PRECH_N, SA_SENSE, SA_CSOC, SA_DISCH, and PRECHSO_N described below may be included in a control signal CTRPB output from the control logic 140. The page buffer PB1 is specifically described as follows.

Referring to FIG. 7, the page buffer PB1 may be connected to the memory cell through the bit line BL1, and may perform a bit line precharge operation of charging a charge supplied from a power voltage VCORE through first to fifth NMOS transistors N1 to N5 and first to third PMOS transistors P1 to P3. In addition, the page buffer PB1 may discharge the charge charged to the bit line BL1 to a ground voltage through the first NMOS transistor N1, the fourth NMOS transistor N4, and the fifth NMOS transistor N5.

The first NMOS transistor N1 is connected between the bit line BL1 and a common node CSO. The first PMOS transistor P1 is connected between the power voltage VCORE and a sense amplifier node SAN. The second NMOS transistor N2 is connected between the common node CSO and the sense amplifier node SAN. The second PMOS transistor P2 is connected between the sense amplifier node SAN and a sensing node SO. The third NMOS transistor N3 is connected between the sensing node SO and the common node CSO. The third PMOS transistor P3 is connected between the power voltage VCORE and the sensing node SO. The fourth and fifth NMOS transistors N4 and N5 are connected in series between the common node CSO and the ground voltage.

The first NMOS transistor N1 is controlled by the page buffer sensing signal PB_SENSE, the second NMOS transistor N2 is controlled by the current sensing signal SA_CSOC, and the third NMOS transistor N3 is controlled by the sense amplifier sensing signal SA_SENSE. In addition, the fourth NMOS transistor N4 is controlled by the sense amplifier discharge signal SA_DISCH, and the fifth NMOS transistor N5 and the first PMOS transistor P1 are controlled by a voltage of a node QS of a sensing latch circuit LATS. The second PMOS transistor P2 is controlled by the sense amplifier precharge signal SA_PRECH_N, and the third PMOS transistor P3 is controlled by the sensing node precharge signal PRECHSO_N. That is, the page buffer sensing signal PB_SENSE is applied to a gate of the first NMOS transistor N1, the current sensing signal SA_CSOC is applied to a gate of the second NMOS transistor N2, and the sense amplifier sensing signal SA_SENSE is applied to a gate of the third NMOS transistor N3. In addition, the sense amplifier discharge signal SA_DISCH is applied to a gate of the fourth NMOS transistor N4, and the voltage of the node QS of the sensing latch circuit LATS is applied to gates of the fifth NMOS transistor N5 and the first PMOS transistor P1. The sense amplifier precharge signal SA_PRECH_N is applied to a gate of the second PMOS transistor P2, and the sensing node precharge signal PRECHSO_N is applied to a gate of the third PMOS transistor P3.

The sensing latch circuit LATS may include a latch configured of two inverters (not shown) connected to the node QS, and a reset transistor (not shown) and a set transistor (not shown) that control the voltage of the node QS.

Figure 8:
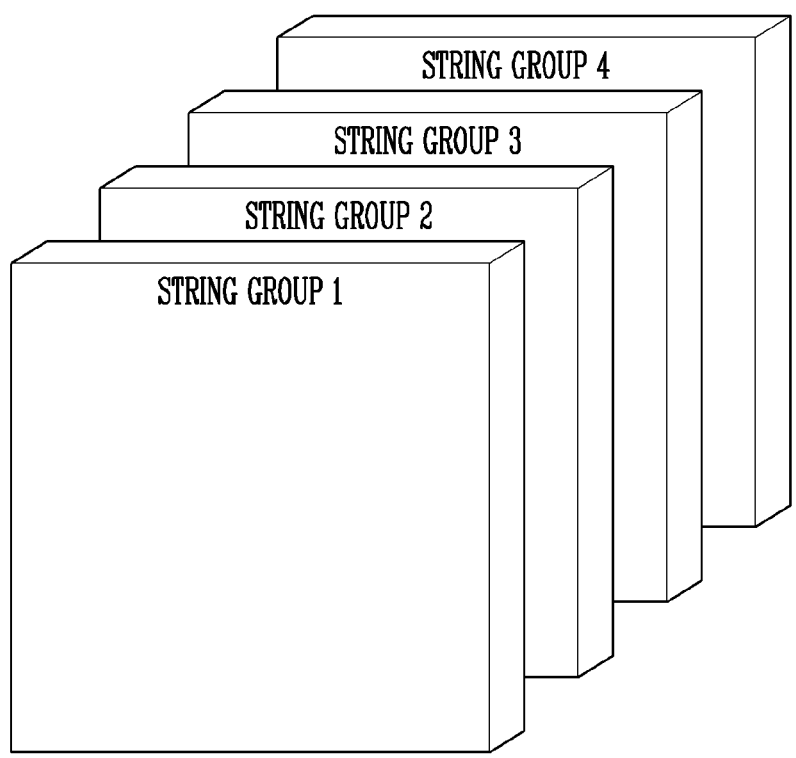
FIG. 8 is a diagram illustrating another example of a string group configuring a memory block.

FIG. 8 is a diagram illustrating another example of a string group configuring a memory block. Meanwhile, FIG. 9 is a circuit diagram illustrating a portion of a cell string included in first to fourth string groups.

Referring to FIG. 8, the memory block may include four string groups STRING GROUP 1 to STRING GROUP 4. As described above with reference to FIG. 4, the string group included in the memory block may be defined as the cell strings that share the drain select line or the source select line. The memory block shown in FIG. 5 may include two string groups, but as shown in FIG. 8, the memory block may be configured to include four string groups.

Figure 9:
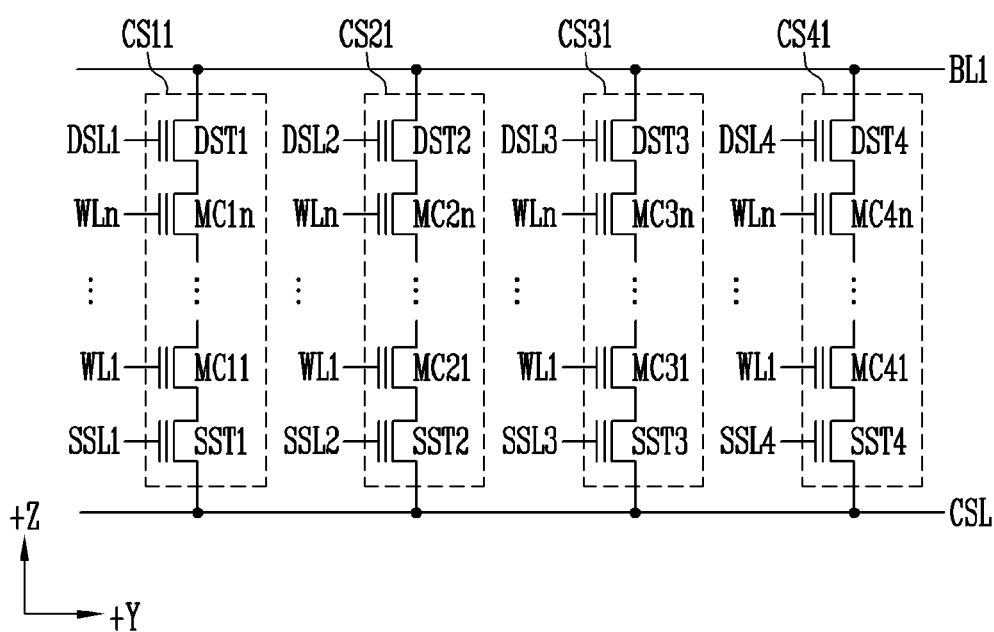
FIG. 9 is a circuit diagram illustrating a portion of a cell string included in first to fourth string groups.

Referring to FIG. 9, the cell string CS11 included in the first string group STRING GROUP 1, the cell string CS21 included in the second string group STRING GROUP 2, the cell string CS31 included in the third string group STRING GROUP 3, and the cell string CS41 included in the fourth string group STRING GROUP 4 are shown. FIG. 9 may be a circuit diagram illustrating the memory block shown in FIG. 8 in the +X direction.

The cell string CS11 of the first string group STRING GROUP 1 includes memory cells MC11 to MC1$n$ connected between a first drain select transistor DST1 and a first source select transistor SST1. The cell string CS21 of the second string group STRING GROUP 2 includes memory cells MC21 to MC2$n$ connected between a second drain select transistor DST2 and a second source select transistor SST2. The cell string CS31 of the third string group STRING GROUP 3 includes memory cells MC31 to MC3$n$ connected between a third drain select transistor DST3 and a third source select transistor SST3. The cell string CS41 of the fourth string group STRING GROUP 4 includes memory cells MC41 to MC4$n$ connected between a fourth drain select transistor DST4 and a fourth source select transistor SST4.

The memory block including the two string groups is with reference to FIGS. 5 to 7. However, as shown in FIGS. 8 and 9, the memory block including the four string groups may also be configured.

In an embodiment of the present disclosure, the source select lines SSL1 to SSL4 shown in FIG. 9 may be grouped into two source select line groups. For example, it is assumed that the first string group STRING GROUP 1 is a program target. In this case, the first string group STRING GROUP 1 becomes a selected string group, and the second to fourth string groups STRING GROUP 2 to STRING GROUP 4 become unselected string groups. The cell string CS11 is included in the selected string group, and each of the cell strings CS21, CS31, and CS41 is included in the unselected string group.

For example, the first source select line SSL1 connected to the first string group STRING GROUP 1 which is the selected string group among the source select lines SSL1 to SSL4, and the second source select line SSL2 connected to any one of the unselected string groups, for example, the second string group STRING GROUP 2 may belong to a first source select line group. Meanwhile, the third and fourth source select lines SSL3 and SSL4 connected to the remaining unselected string groups, that is, the third and fourth string groups STRING GROUP 3 and STRING GROUP 4, respectively, may belong to a second source select line group. In accordance with the semiconductor memory device and a method of operating the same according to an embodiment of the present disclosure, a voltage of the first source select line group may be increased and a voltage of the second source select line group may be maintained in the verify phase during the program operation of the semiconductor memory device. Accordingly, the source select transistors SST1 and SST2 connected to the first source select line group are turned on, and the source select transistors SST3 and SST4 connected to the second source select line group are turned off. Thereafter, a verify voltage may be applied to a selected word line among word lines connected to the selected memory block, and a verify pass voltage may be applied to an unselected word line.

In an embodiment, source select lines belonging to the same source select line group may be connected to each other. For example, the first source select line SSL1 and the second source select line SSL2 belonging to the first source select line group may be electrically connected to each other. In addition, the third source select line SSL3 and the fourth source select line SSL4 belonging to the second source select line group may be electrically connected to each other.

Meanwhile, in FIG. 9, an embodiment in which the memory block includes the four string groups is shown, but the present disclosure is not limited thereto. For example, the memory block included in the semiconductor memory device according to an embodiment of the present disclosure may include N string groups. Here, N may be a natural number greater than or equal to 4.

The semiconductor memory device and the method of operating the same according to an embodiment of the present disclosure are described with reference to FIGS. 11 to 16.

Figure 10:
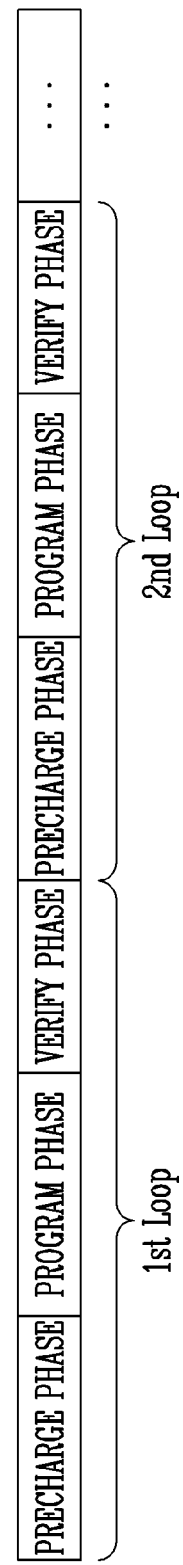
FIG. 10 is a diagram illustrating a program operation of a semiconductor memory device according to an embodiment of the present disclosure.

FIG. 10 is a diagram illustrating a program operation of a semiconductor memory device according to an embodiment of the present disclosure.

Referring to FIG. 10, the program operation of the semiconductor memory device may include a plurality of loops. Each loop includes a precharge phase, a program phase, and a verify phase.

In the precharge phase, a bit line voltage of a string group that is a program target in the memory block is set, and a string precharge operation of a string group that is not the program target in the memory block is performed.

The operation of setting the bit line voltage of the string group that is the program target includes setting the bit line voltage to a program allowable voltage or a program inhibition voltage in order to program data in pages that are the program targets. As a program pulse is applied to the selected word line in a subsequent program phase, a threshold voltage of the memory cell connected to the bit line set as the program allowable voltage may move. Meanwhile, in a subsequent program phase, the threshold voltage of the memory cell connected to the bit line set as the program inhibition voltage might not move.

In an embodiment, the program allowable voltage may be the ground voltage. In this case, in the structure of the page buffer PB1 as shown in FIG. 7, the ground voltage may be transferred to the bit line BL1 through the fifth NMOS transistor N5, the fourth NMOS transistor N4, and the first NMOS transistor N1.

In an embodiment, the program inhibition voltage may be the power voltage VCORE. In this case, in the structure of the page buffer PB1 as shown in FIG. 7, the power voltage VCORE may be transferred to the bit line BL1 through the first PMOS transistor P1, the second NMOS transistor N2, and the first NMOS transistor N1. In another embodiment, the power voltage VCORE may be transferred to the bit line BL1 through the first PMOS transistor P1, the second PMOS transistor P2, the third NMOS transistor N3, and the first NMOS transistor N1.

When the program allowable voltage is transferred to the bit line and the program inhibition voltage is transferred to the bit line, the first NMOS transistor N1 may be turned on, and thus the corresponding voltages are transferred to the bit line. That is, the operation of setting the bit line voltage is performed by increasing the page buffer sensing signal PB_SENSE applied to the page buffers PB1 to PBm from a turn-off voltage to a turn-on voltage.

In the program phase, a program pulse is applied to the selected word line and the program pass voltage is applied to the unselected word line to selectively move the threshold voltage of the memory cells included in the selected page. At this time, the threshold voltage of the memory cells included in the selected page may be moved or maintained according to the respective bit line voltages set in the precharge phase. That is, in the memory cell connected to the bit line set to apply the program allowable voltage in the precharge phase, the threshold voltage may move as the program pulse is applied to the selected word line. In addition, in the memory cell connected to the bit line set to apply the program inhibition voltage in the precharge phase, the threshold voltage might not move even though the program pulse is applied to the selected word line.

In the verify phase, it is checked through the verify voltage whether the memory cells included in the selected page are programmed to a target program state. When the threshold voltage of the memory cells of a predetermined ratio or more among the memory cells included in the selected page reaches a target level, the program operation is completed. In this case, a subsequent loop is not performed and the program operation is ended. When the memory cells of which the threshold voltage reaches the target level is less than the predetermined ratio among the memory cells included in the selected page, the program operation is not ended, and the subsequent loop is performed. The word "predetermined" as used herein with respect to a parameter, such as a predetermined ratio, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 11:
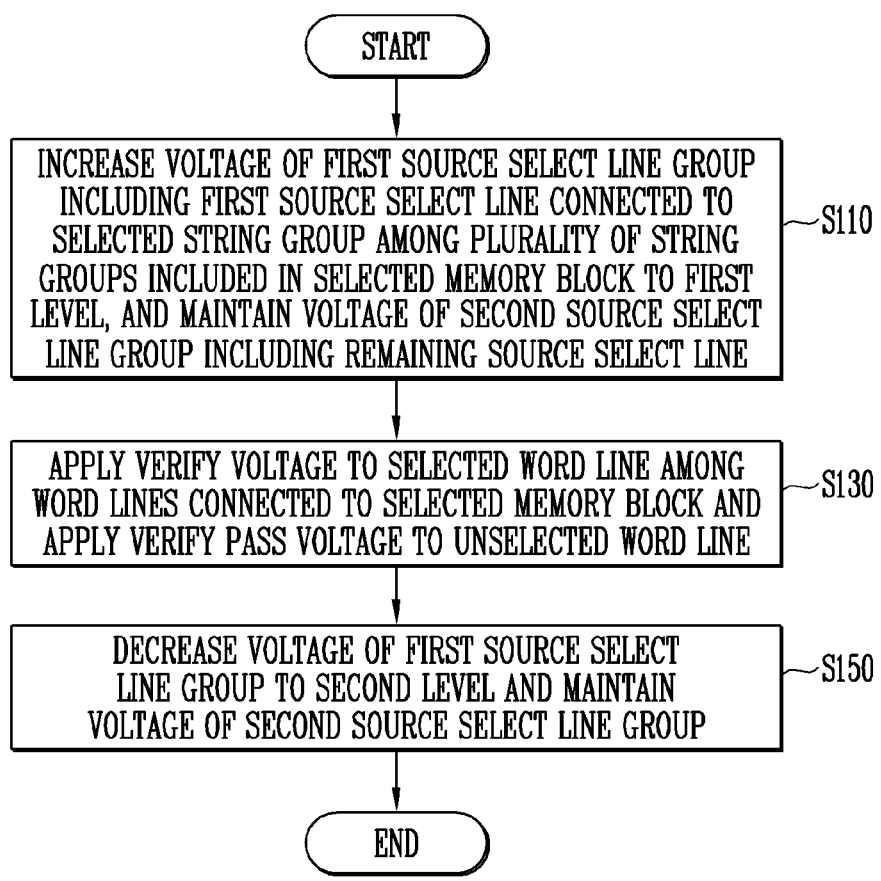
FIG. 11 is a flowchart illustrating an embodiment of a verify phase during a program operation of a semiconductor memory device according to an embodiment of the present disclosure.

FIG. 11 is a flowchart illustrating an embodiment of a verify phase during a program operation of a semiconductor memory device according to an embodiment of the present disclosure. Referring to FIG. 11, the verify phase includes increasing the voltage of the first source select line group including the first source select line connected to the selected string group among the plurality of string groups included in the selected memory block to the first level, and maintaining the voltage of the second source select line group including the remaining source select lines (S110), applying the verify voltage to the selected word line among the word lines connected to the selected memory block and applying the verify pass voltage to the unselected word lines (S130), and decreasing the voltage of the first source select line group to the second level and maintaining the voltage of the second source select line group (S150). Hereinafter, a case where the first string group among the string groups of FIG. 8 is the selected string group is described as an example.

In step S110, the voltage of the first source select line group is increased to the first level, and the voltage of the second source select line group is maintained. The first source select line group may include at least the source select line connected to the selected string group. In the example described with reference to FIGS. 8 and 9, since the first string group STRING GROUP 1 is the selected string group, the first source select line group includes the first source select line SSL1. In addition, at least one of the second to fourth source select lines SSL2 to SSL4 respectively connected to the unselected string groups may be included in the first source select line group. For example, the second source select line SSL2 may be included in the first source select line group.

When the first and second source select lines SSL1 and SSL2 are included in the first source select line group, the third and fourth source select lines SSL3 and SSL4 which are the remaining source select lines are included in the second source select line group.

That is, the first source select line group includes the source select line connected to the selected string group and the source select line connected to one unselected string group. Meanwhile, the second source select line group includes the source select lines connected to the unselected string groups, respectively.

Meanwhile, in step S110, a voltage of the drain select line connected to the selected string group may be increased to the first level, and the voltage of the drain select lines connected to the unselected string group may be maintained.

In step S130, the verify voltage is applied to the selected word line among the word lines connected to the selected memory block, and the verify pass voltage is applied to the unselected word line. Accordingly, a threshold voltage verify operation of the memory cells connected to the selected word lines among the memory cells of the selected string group is performed.

In step S150, the voltage of the first source select line group is decreased to the second level, and the voltage of the second source select line group is maintained. In an embodiment, the second level may be the ground voltage. Accordingly, the voltage of the first source select line group that is increased to the first level in step S110 may be decreased to the ground voltage again. In step S150, the voltage of the second source select line group may maintain the ground voltage.

As steps S110 to S150 are performed, the verify phase included in one program loop during the program operation may be performed. Steps S110 to S150 are described with reference to FIG. 13.

Figure 12:
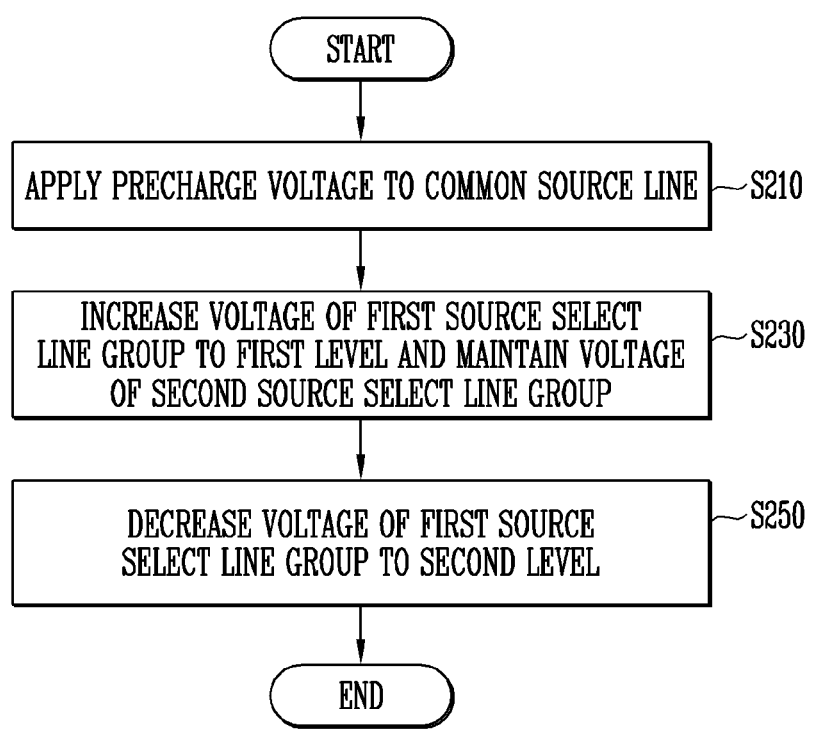
FIG. 12 is a flowchart illustrating an embodiment of a precharge phase during a program operation of a semiconductor memory device according to an embodiment of the present disclosure.

FIG. 12 is a flowchart illustrating an embodiment of a precharge phase during a program operation of a semiconductor memory device according to an embodiment of the present disclosure.

Referring to FIG. 12, the precharge phase includes applying the precharge voltage to the common source line (S210), increasing the voltage of the first source select line group to the first level, and maintaining the voltage of the second source select line group (S230), and decreasing the voltage of the first source select line group to the second level (S250).

In step S210, the precharge voltage is applied to the common source line. The precharge voltage is a voltage for precharging a negatively boosted channel voltage of the cell strings included in the unselected string group connected to the second source select line SSL2, that is, the second string group STRING GROUP 2 among the first source select line groups. Thereafter, in step S230, as the voltage of the first source select line group is increased to the first level, which is the turn-on voltage, the second source select transistor SST2 included in the second string group STRING GROUP 2 is turned on. Accordingly, the negatively boosted channel voltage of the cell strings CS21 to CS2m included in the second string group STRING GROUP 2 is precharged.

Thereafter, in step S250, the voltage of the first source select line group may be decreased to the second level, that is, the ground voltage. As steps S210 to S250 are performed, the precharge phase included in one program loop during the program operation may be performed. Steps S210 to S250 are described with reference to FIG. 13.

Figure 13:
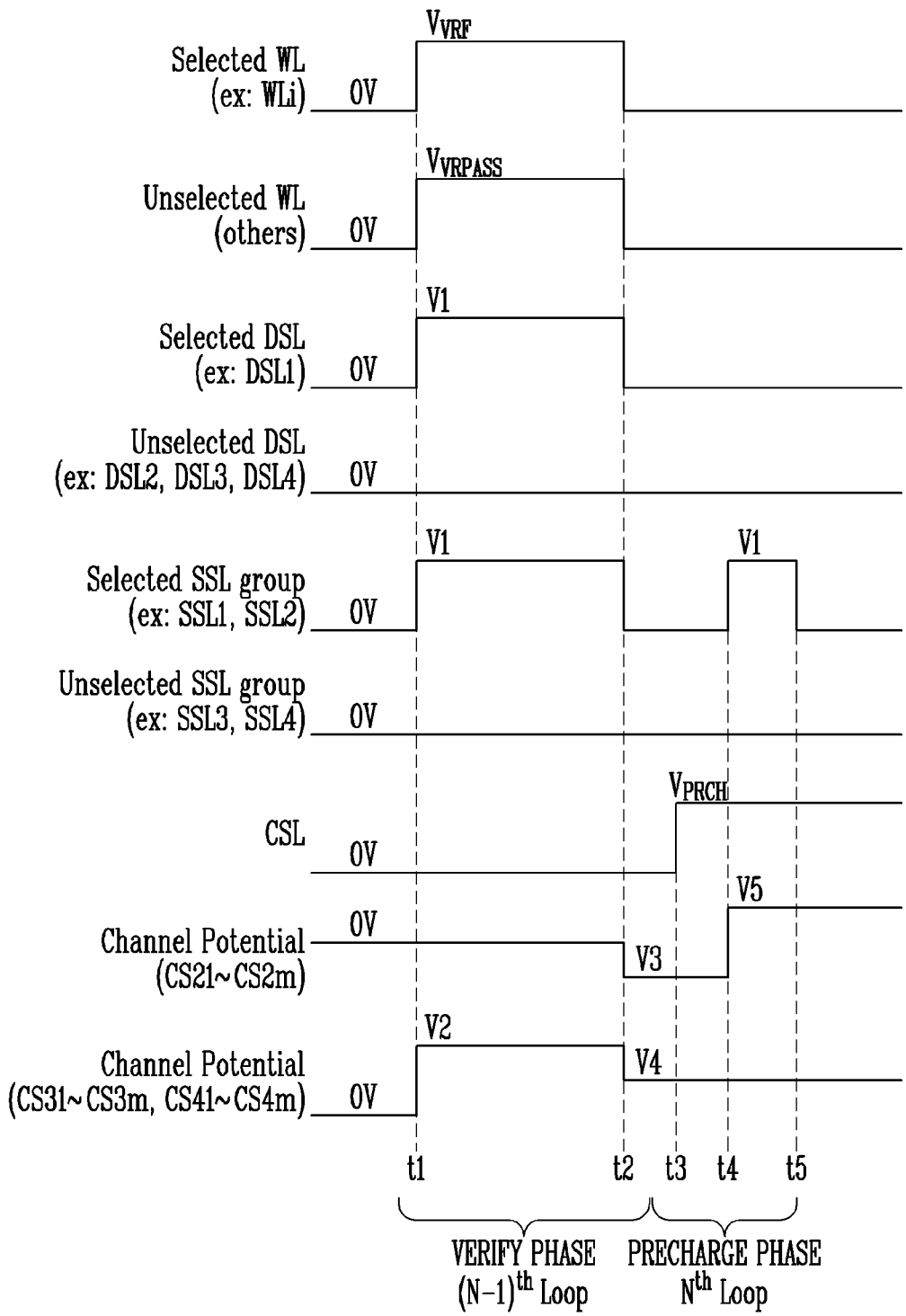
FIG. 13 is a timing diagram illustrating the embodiment according to FIGS. 11 and 12.

FIG. 13 is a timing diagram illustrating the embodiment according to FIGS. 11 and 12. In FIG. 13, the verify phase of an (N−1)-th program loop and the precharge phase of an N-th program loop are shown. Referring to FIG. 13, a case where the first string group among the first to fourth string groups included in the memory block is selected as the program target is shown. For example, in FIG. 13, a case where the memory cells connected to an i-th word line WLi among the memory cells included in the first string group are selected as program target memory cells is shown.

In FIG. 13, a voltage applied to the selected i-th word line WLi and a voltage applied to the unselected word lines are shown. In addition, the voltage applied to the first drain select line DSL1 connected to the selected first string group STRING GROUP 1 and the voltage applied to the second to fourth drain select lines DSL2 to DSL4 respectively connected to the second to fourth string groups STRING GROUP 2 to STRING GROUP 4 are shown. In addition, the voltage applied to the first source select line group including the first source select line SSL1 connected to the selected first string group STRING GROUP 1 and the voltage applied to the second source select line group including the remaining unselected source select lines are shown. For example, the first source select line group includes the first and second source select lines SSL1 and SSL2, and the second source select line group includes the third and fourth source select lines SSL3 and SSL4. Meanwhile, in FIG. 13, a voltage of the common source line CSL is shown. In addition, FIG. 13 shows a channel potential of the cell strings included in the second string group STRING GROUP 2 connected to the second source select line SSL2 belonging to the first source select line group among the unselected string groups and a channel potential of the cell strings included in the third and fourth string groups STRING GROUP 3 and STRING GROUP 4 connected to the third and fourth source select lines SSL3 and SSL4 belonging to the second source select line group.

At a time t1 of the verify phase, a verify voltage $V_{VRF}$ is applied to the selected word line WLi, and a verify pass voltage $V_{VRPASS}$ is applied to the unselected word lines. Meanwhile, a turn-on voltage V1 is applied to the first drain select line DSL1, and the ground voltage, which is the turn-off voltage, is applied to the second to fourth drain select lines DSL2 to DSL4. In addition, the turn-on voltage V1 is applied to the first and second source select lines SSL1 and SSL2 belonging to the first source select line group, and the voltage of the third and fourth source select lines SSL3 and SSL4 belonging to the second source select line group maintains the ground voltage. Meanwhile, the voltage of the common source line CSL also maintains the ground voltage.

At the time t1, since the turn-on voltage is applied to the first and second source select lines SSL1 and SSL 2, the channel potential of the cell strings included in the first and second string groups STRING GROUP 1 and STRING GROUP 2 maintains 0V. This is because the first and second source select transistors SST1 and SST2 are turned on, and thus the voltage of the common source line CSL is transferred to a channel. Meanwhile, at the time t1, since the turn-off voltage is applied to the third and fourth source select lines SSL3 and SSL4, the channel potential of the cell strings included in the third and fourth string groups STRING GROUP 3 and STRING GROUP 4 is boosted up to a voltage V2 according to a word line voltage increase.

At the time t1, the turn-on voltage is applied to both of the first and second source select lines SSL1 and SSL2, but the turn-on voltage is applied only to the first drain select line DSL1 and the turn-off voltage is applied only to the second drain select line DSL2. Therefore, the verify operation may be performed only on the memory cells included in the first string group STRING GROUP 1.

Referring to FIG. 11 together, step S110 may be performed at the time t1. That is, as step S110 is performed, the voltage of the first and second source select lines SSL1 and SSL2 belonging to the first source select line group increases to the voltage V1 which is the first level. Meanwhile, as step S110 is performed, the voltage of the third and fourth source select lines SSL3 and SSL4 belonging to the second source select line group maintains the ground voltage.

In addition, step S130 may also be performed at the time t1. That is, in FIG. 11, step S130 is performed after step S110 is performed, but the present disclosure is not limited thereto. That is, step S110 and step S130 may be simultaneously performed, or step S110 may be performed after step S130 is performed.

Meanwhile, at a time t2, a voltage of the word lines may be decreased to the ground voltage. In addition, at the time t2, the voltage of the first drain select line DSL1 may be decreased to the ground voltage. Meanwhile, at the time t2, the voltage of the first and second source select lines SSL1 and SSL2 belonging to the first source select line group may be decreased to the ground voltage.

As the voltage of the second source select line SSL2 is decreased to the ground voltage at the time t2, the second source select transistor SST2 is turned off. Meanwhile, as the voltages of the word lines is decreased all together, a channel potential of the cell strings CS21 to CS2$m$ of the second string group STRING GROUP 2 connected to the second source select line SSL2 may be negatively boosted to a voltage V3, which is a negative value.

Meanwhile, a channel potential of the cell strings CS31 to CS3$m$ and CS41 to CS4$m$ included in the third and fourth string groups STRING GROUP 3 and STRING GROUP 4 connected to the third and fourth source select lines SSL3 and SSL4, respectively, may also be negatively boosted to a voltage V4. However, since the channel potential of the cell strings CS31 to CS3$m$ and CS41 to CS4$m$ is already boosted to the voltage V2 at the time t1, even though the channel voltage is negatively boosted at the time t2, the final potential of the voltage V4 may have a positive value.

On the other hand, since the channel potential of the cell strings CS21 to CS2$m$ of the second string group STRING GROUP 2 is negatively boosted from the ground voltage, the final potential of the voltage V3 may be a negative value. Therefore, the channel voltage that is negatively boosted to the negative value is required to be increased in the precharge phase.

Referring to FIG. 11 together, step S150 may be performed at the time t2. That is, at the time t2, the voltage of the first and second source select lines SSL1 and SSL2 belonging to the first source select line group may be decreased to the second level, that is, the ground voltage, and the voltage of the third and fourth source select lines SSL3 and SSL4 belong to the second source select line group may be maintained.

That is, the verify phase of the (N−1)-th program loop is performed in a period t1 to t2 of FIG. 13.

Thereafter, at a time t3, a precharge voltage $V_{PRCH}$ is applied to the common source line CSL. In this state, at a time t4, the voltage of the first and second source select lines SSL1 and SSL2 belonging to the first source select line group are increased to the first voltage level V1. As the first and second source select transistors SST1 and SST2 are turned on, the channel potential of the cell strings CS21 to CS2$m$ of the second string group STRING GROUP 2, which is negatively boosted to the negative voltage value V3, may be increased to a voltage V5. In an embodiment, a voltage value of the voltage V5 may be substantially the same as the precharge voltage $V_{PRCH}$. Meanwhile, since the voltage of the third and fourth source select lines SSL3 and SSL4 belonging to the second source select line group is maintained at 0V at the time t4, the third and fourth source select transistors SST3 and SST4 maintain a turn-off state. That is, the channel potential of the cell strings CS31 to CS3$m$ and CS41 to CS4$m$ included in the third and fourth string groups STRING GROUP 3 and STRING GROUP 4 may be maintained. Thereafter, at a time t5, the voltage of the first and second source select lines SSL1 and SSL2 belonging to the first source select line group may be decreased to the ground voltage which is the second level.

Referring to FIG. 12 together, step S210 may be performed at the time t3 and step S230 may be performed at the time t4. That is, in FIGS. 12 and 13, step S210 of applying the precharge voltage $V_{PRCH}$ to the common source line CSL is performed before step S230 of increasing the voltage of the first and second source select lines SSL1 and SSL2 belonging to the first source select line group. However, this is an example, and the present disclosure is not limited thereto. Differently from that shown in FIGS. 12 and 13, step S210 and step S230 may be simultaneously performed, or step S230 may be performed before step S210. Meanwhile, step S250 of FIG. 12 may be performed at the time t5.

That is, the precharge phase of the N-th program loop is performed in a period t3 to t5 of FIG. 13.

Referring to FIG. 13, the channel potential of the cell strings of the second string group STRING GROUP 2, which is decreased to the negative voltage by negative boosting in the verify phase may be precharged in the precharge phase. Accordingly, since the channel potential of the cell strings included in the unselected string groups is sufficiently increased in the program phase, program disturb may be prevented.

Figure 14:
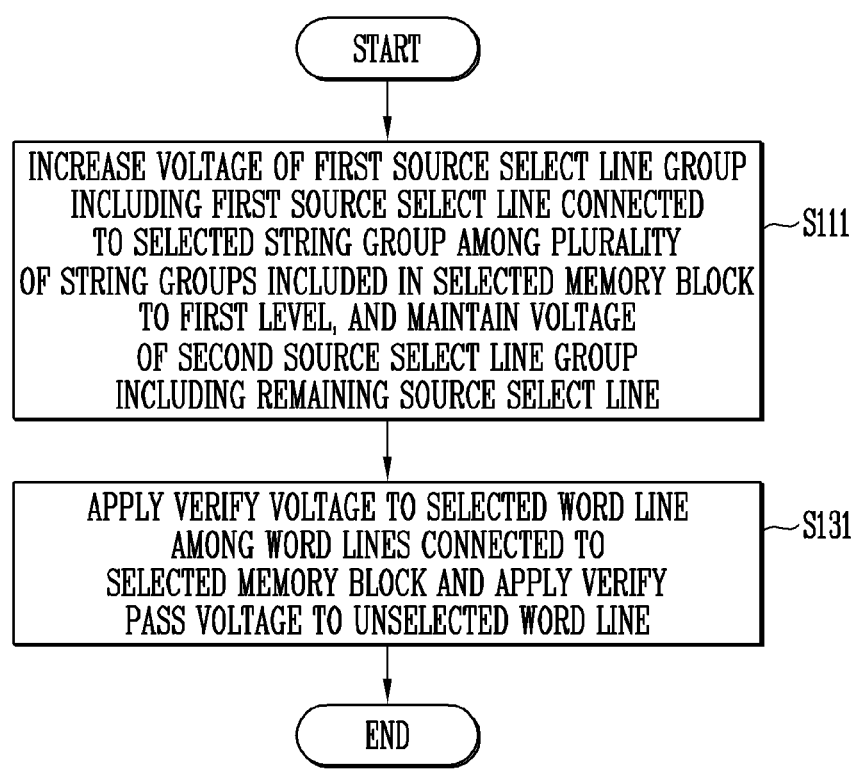
FIG. 14 is a flowchart illustrating an embodiment of a verify phase during a program operation of a semiconductor memory device according to another embodiment of the present disclosure.

FIG. 14 is a flowchart illustrating an embodiment of a verify phase during a program operation of a semiconductor memory device according to another embodiment of the present disclosure.

Referring to FIG. 14, the verify phase includes increasing the voltage of the first source select line group including the first source select line connected to the selected string group among the plurality of string groups included in the selected memory block to the first level and maintaining the voltage of the second source select line group including the remaining source select lines (S111), and applying the verify voltage to the selected word line among the word lines connected to the selected memory block and applying the verify pass voltage to the unselected word lines (S131). Step S111 may be substantially the same as step S110 of FIG. 11, and step S131 may be substantially the same as step S130 of FIG. 11. Therefore, a repetitive description is omitted.

Referring to FIGS. 11 and 14 together, a case of the embodiment of FIG. 11 includes decreasing the voltage of the first source select line group to the second level and maintaining the voltage of the second source select line group (S150). On the other hand, FIG. 14 does not include a corresponding step. Accordingly, even though the word line voltages are decreased, negative boosting of the channel potential of the strings in the second string group might not occur. This is described with reference to FIG. 16.

Figure 15:
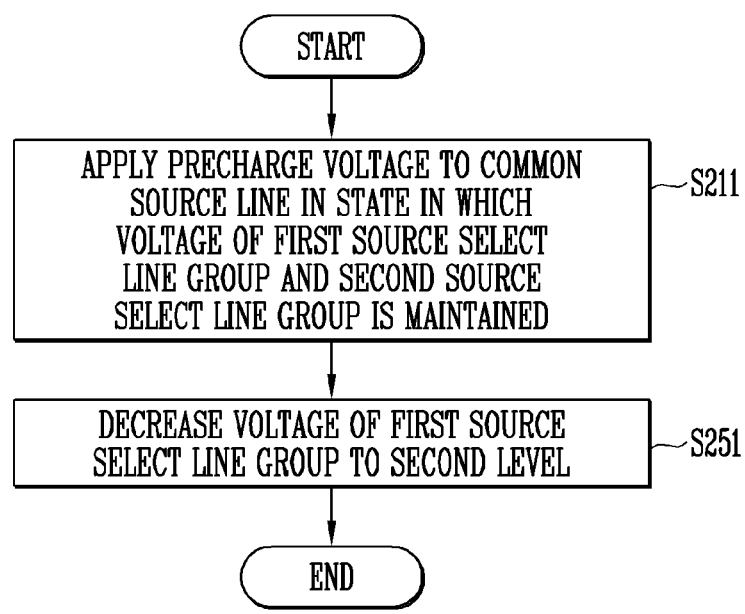
FIG. 15 is a flowchart illustrating an embodiment of a precharge phase during a program operation of a semiconductor memory device according to another embodiment of the present disclosure.

FIG. 15 is a flowchart illustrating an embodiment of a precharge phase during a program operation of a semiconductor memory device according to another embodiment of the present disclosure.

Referring to FIG. 15, the precharge phase includes applying the precharge voltage to the common source line, while maintaining the voltages of the first source select line group and the second source select line group (S211) and decreasing the voltage of the first source select line group to the second level (S251).

Step S211 is similar to step S210 of FIG. 12, and step S251 is similar to step S250 of FIG. 12. Therefore, a repetitive description is omitted.

Referring to FIGS. 12 and 15 together, a case of the embodiment of FIG. 12 includes increasing the voltage of the first source select line group to the first level and maintaining the voltage of the second source select line group (S230). On the other hand, FIG. 15 does not include a corresponding step. This is described with reference to FIG. 16.

Figure 16:
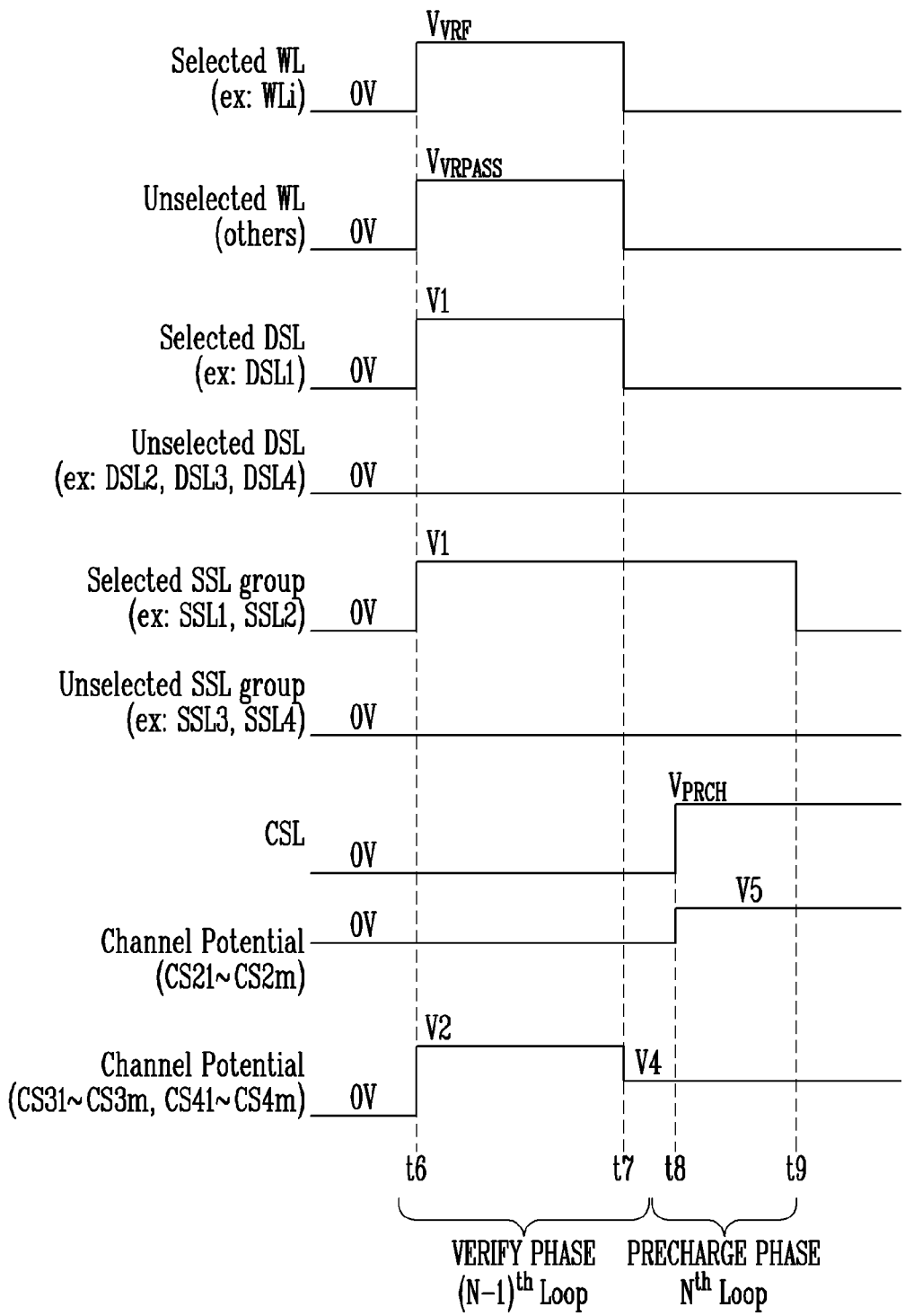
FIG. 16 is a timing diagram illustrating the embodiment according to FIGS. 14 and 15.

FIG. 16 is a timing diagram illustrating the embodiment according to FIGS. 14 and 15.

In FIG. 16, the verify phase of the (N−1)-th program loop and the precharge phase of the N-th program loop are shown. Similarly to that described with reference to FIG. 13, referring to FIG. 16, a case where the first string group among the first to fourth string groups included in the memory block is selected as the program target is shown. For example, FIG. 16 shows a case where the memory cells connected to the i-th word line WLi among the memory cells included in the first string group are selected as the program target memory cells. Hereinafter, a description repetitive to that of FIG. 13 is omitted.

At a time t6 of the verify phase, the verify voltage $V_{VRF}$ is applied to the selected word line WLi, and the verify pass voltage $V_{VRPASS}$ is applied to the unselected word lines. Meanwhile, the turn-on voltage V1 is applied to the first drain select line DSL1, and the ground voltage, which is the turn-off voltage, is applied to the second to fourth drain select lines DSL2 to DSL4. In addition, the turn-on voltage V1 is applied to the first and second source select lines SSL1 and SSL2 belonging to the first source select line group, and the voltage of the third and fourth source select lines SSL3 and SSL4 belonging to the second source select line group maintains the ground voltage. Meanwhile, the voltage of the common source line CSL also maintains the ground voltage.

At the time t6, since the turn-on voltage is applied to the first and second source select lines SSL1 and SSL 2, the channel potential of the cell strings included in the first and second string groups STRING GROUP 1 and STRING GROUP 2 maintains 0V. This is because the first and second source select transistors SST1 and SST2 are turned on, and thus the voltage of the common source line CSL is transferred to a channel. Meanwhile, at the time t6, since the turn-off voltage is applied to the third and fourth source select lines SSL3 and SSL4, the channel potential of the cell strings included in the third and fourth string groups STRING GROUP 3 and STRING GROUP 4 is boosted up to the voltage V2 according to the word line voltage increase.

Referring to FIG. 14 together, step S111 may be performed at the time t6. That is, as step S111 is performed, the voltage of the first and second source select lines SSL1 and SSL2 belonging to the first source select line group increases to the voltage V1 which is the first level. Meanwhile, as step S111 is performed, the voltage of the third and fourth source select lines SSL3 and SSL4 belonging to the second source select line group maintains the ground voltage.

In addition, step S131 may also be performed at the time t6. That is, in FIG. 14, step S131 is performed after step S111 is performed, but the present disclosure is not limited thereto. That is, step S111 and step S131 may be simultaneously performed, or step S111 may be performed after step S131 is performed.

Meanwhile, at a time t7, the voltage of the word lines may be decreased to the ground voltage. In addition, at the time t7, the voltage of the first drain select line DSL1 may be decreased to the ground voltage. Meanwhile, at the time t7, the voltage of the first and second source select lines SSL1 and SSL2 belonging to the first source select line group may be maintained. This point is different from the embodiment of FIG. 13. In the embodiment of FIG. 13, at the time t2, the voltage of the first and second source select lines SSL1 and SSL2 belonging to the first source select line group may be decreased to the ground voltage (S150). On the other hand, in an embodiment of FIG. 16, at the time t7, the voltage of the first and second source select lines SSL1 and SSL2 is maintained.

As the voltage of the second source select line SSL2 maintains the turn-on voltage at the time t7, the second source select transistor SST2 maintains the turn-on state. Therefore, even though the voltages of the word lines are decreased all together, the channel potential of the cell strings CS21 to CS2m of the second string group STRING GROUP 2 connected to the second source select line SSL2 may maintain 0V.

Meanwhile, at the time t7, the channel potential of the cell strings CS31 to CS3m and CS41 to CS4m included in the third and fourth string groups STRING GROUP 3 and STRING GROUP 4 connected to the third and fourth source select lines 55L3 and 55L4, respectively, may be negatively boosted to the voltage V4. However, since the channel potential of the cell strings CS31 to CS3m and CS41 to CS4m is already boosted to the voltage V2 at the time t6, even though the channel voltage is negatively boosted at the time t7, the final potential of the voltage V4 may have a positive value.

On the other hand, since the channel potential of the cell strings CS21 to CS2m of the second string group STRING GROUP 2 maintains the ground voltage, the channel voltage is required to be increased in the precharge phase.

Thereafter, at a time t8, the precharge voltage $V_{PRCH}$ is applied to the common source line CSL. Therefore, at the time t8, the channel potential of the cell strings CS21 to CS2m of the second string group STRING GROUP 2 may increase from the ground voltage to the voltage V5. In an embodiment, the voltage value of the voltage V5 may be substantially the same as the precharge voltage $V_{PRCH}$. Meanwhile, since the voltage of the third and fourth source select lines SSL3 and SSL4 belonging to the second source select line group is maintained at 0V at the time t8, the third and fourth source select transistors SST3 and SST4 maintain the turn-off state. That is, the channel potential of the cell strings CS31 to CS3m and CS41 to CS4m included in the third and fourth string groups STRING GROUP 3 and STRING GROUP 4 may be maintained. Thereafter, at a time t9, the voltage of the first and second source select lines SSL1 and SSL2 belonging to the first source select line group may be decreased to the ground voltage which is the second level.

Referring to FIG. 15 together, step S211 may be performed at the time t8 and step S251 may be performed at the time t9. That is, the precharge phase of the N-th program loop is performed in a period t8 to t9 of FIG. 16.

Referring to FIG. 16, in the verify phase, the channel potential of the cell strings of the second string group STRING GROUP 2 maintains the ground voltage. Therefore, in the precharge phase, the channel potential of the cell strings of the second string group STRING GROUP 2 may be precharged. Accordingly, since the channel potential of the cell strings included in the unselected string groups is sufficiently increased in the program phase, program disturb may be prevented.

Figure 17:
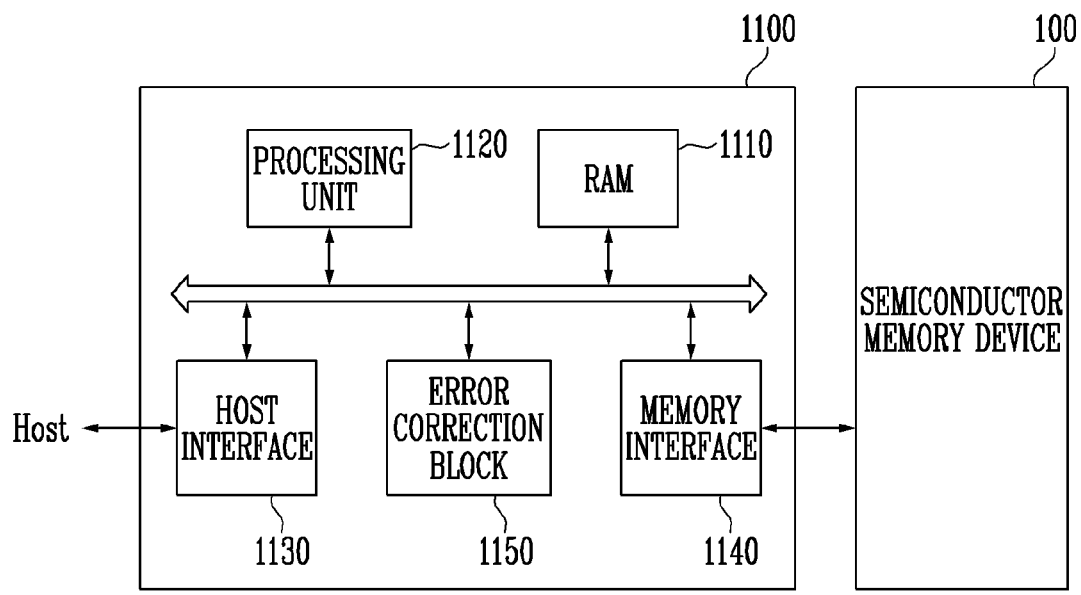
FIG. 17 is a block diagram illustrating an embodiment of a memory system including the semiconductor memory device of FIG. 1.

FIG. 17 is a block diagram illustrating an embodiment of a memory system including the semiconductor memory device 100 of FIG. 1.

Referring to FIG. 17, the memory system 1000 includes the semiconductor memory device 100 and a memory controller 1100. The semiconductor memory device 100 may be the semiconductor memory device described with reference to FIG. 1.

The memory controller 1100 is connected to a host Host and the semiconductor memory device 100. The memory controller 1100 is configured to access the semiconductor memory device 100 in response to a request from the host Host. For example, the memory controller 1100 is configured to control read, write, erase, and background operations of the semiconductor memory device 100. The memory controller 1100 is configured to provide an interface between the semiconductor memory device 100 and the host Host. The memory controller 1100 is configured to drive firmware for controlling the semiconductor memory device 100.

The memory controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls an overall operation of the memory controller 1100. In addition, the memory controller 1100 may temporarily store program data provided from the host Host during the write operation.

The host interface 1130 includes a protocol for performing data exchange between the host Host and the memory controller 1100. As an embodiment, the memory controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 includes a NAND interface or a NOR interface.

The error correction block 1150 is configured to detect and correct an error of data received from the semiconductor memory device 100 using an error correcting code (ECC). The processing unit 1120 may control the semiconductor memory device 100 to adjust a read voltage and perform re-read according to an error detection result of the error correction block 1150. As an embodiment, the error correction block may be provided as a component of the memory controller 1100.

The memory controller 1100 and the semiconductor memory device 100 may be integrated into one semiconductor device. As an embodiment, the memory controller 1100 and the semiconductor memory device 100 may be integrated into one semiconductor device to form a memory card. For example, the memory controller 1100 and the semiconductor memory device 100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The memory controller 1100 and the semiconductor memory device 100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an embodiment, the semiconductor memory device 100 or the memory system may be mounted as a package of various types. For example, the semiconductor memory device 100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi-chip package (MCP), a wafer-level fabricated package (WFP), or a wafer-level processed stack package (WSP).

Figure 18:
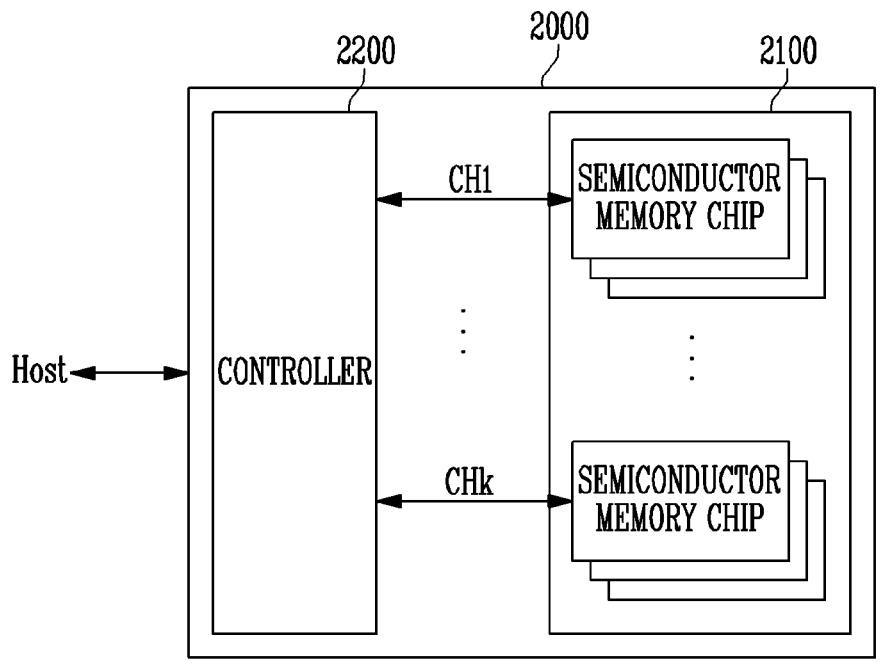
FIG. 18 is a block diagram illustrating an application example of the memory system of FIG. 17.

FIG. 18 is a block diagram illustrating an application example of the memory system of FIG. 17.

Referring to FIG. 18, the memory system 2000 includes a semiconductor memory device 2100 and a memory controller 2200. The semiconductor memory device 2100 includes a plurality of semiconductor memory chips. The plurality of semiconductor memory chips are divided into a plurality of groups.

In FIG. 18, the plurality of groups communicate with the memory controller 2200 through first to k-th channels CH1 to CHk, respectively. Each semiconductor memory chip is configured and is operated similarly to the semiconductor memory device 100 described with reference to FIG. 1.

Each group is configured to communicate with the memory controller 2200 through one common channel. The memory controller 2200 is configured similarly to the memory controller 1100 described with reference to FIG. 17 and is configured to control the plurality of memory chips of the semiconductor memory device 2100 through the plurality of channels CH1 to CHk.

Figure 19:
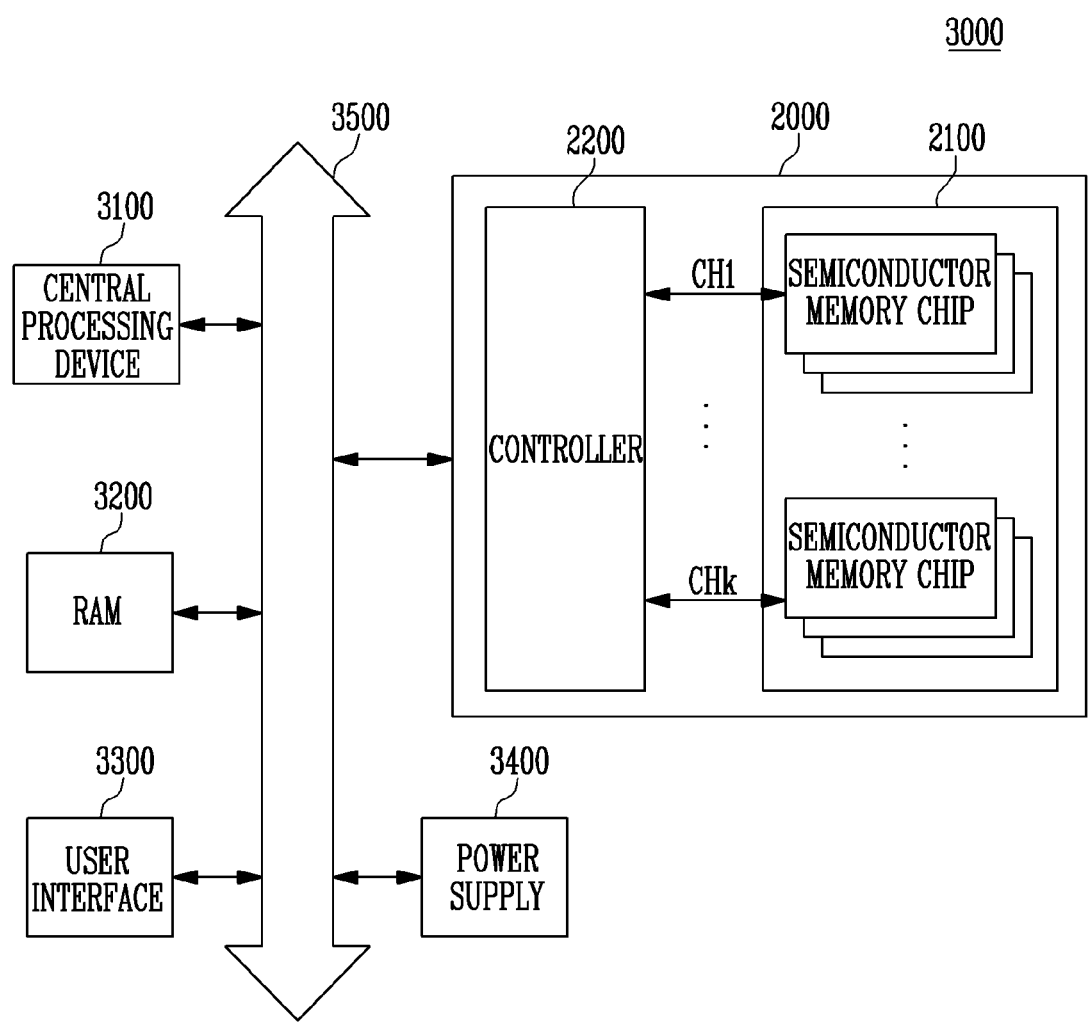
FIG. 19 is a block diagram illustrating a computing system including the memory system described with reference to FIG. 18.

FIG. 19 is a block diagram illustrating a computing system including the memory system described with reference to FIG. 18.

The computing system 3000 includes a central processing device 3100, a random access memory (RAM) 3200, a user interface 3300, a power supply 3400, a system bus 3500, and the memory system 2000.

The memory system 2000 is electrically connected to the central processing device 3100, the RAM 3200, the user interface 3300, and the power supply 3400 through the system bus 3500. Data provided through the user interface 3300 or processed by the central processing device 3100 is stored in the memory system 2000.

In FIG. 19, the semiconductor memory device 2100 is connected to the system bus 3500 through the memory controller 2200. However, the semiconductor memory device 2100 may be configured to be directly connected to the system bus 3500. At this time, a function of the memory controller 2200 is performed by the central processing device 3100 and the RAM 3200.

In FIG. 19, the memory system 2000 described with reference to FIG. 18 is provided. However, the memory system 2000 may be replaced with the memory system 1000 described with reference to FIG. 17. As an embodiment, the computing system 3000 may include both of the memory systems 1000 and 2000 described with reference to FIGS. 17 and 18.

The embodiments of the present disclosure disclosed in the present specification and drawings are merely provided with specific examples to describe the technical content of the present disclosure and to help understanding of the present disclosure, and are not intended to limit the scope of the present disclosure.

What is claimed is:

1. A semiconductor memory device comprising:
   a memory block including a plurality of string groups respectively connected to a corresponding source select line among a plurality of source select lines;
   a peripheral circuit configured to perform a program operation of storing data within the memory block; and
   control logic configured to control the program operation of the peripheral circuit,
   wherein the plurality of source select lines are grouped into a plurality of source select line groups including at least a first source select line group and a second source select line group,
   the first source select line group includes at least a first source select line and a second source select line, and
   the control logic controls the peripheral circuit to increase a voltage of the first source select line group, which includes the first source select line connected to a selected string group and the second source select line connected to an unselected string group, among the plurality of source select line groups to a first level, to apply a verify voltage to a selected word line among word lines connected to the memory block, and to apply a verify pass voltage to an unselected word line.

2. The semiconductor memory device of claim 1, wherein the control logic controls the peripheral circuit to decrease the voltage of the first source select line group to a second level after applying the verify voltage to the selected word line among the word lines connected to the memory block, and applying the verify pass voltage to the unselected word line.

3. The semiconductor memory device of claim 2, wherein the control logic controls the peripheral circuit to maintain a voltage of the second source select line group different from the first source select line group, while increasing the voltage of the first source select line group to the first level, applying the verify voltage to the selected word line among the word lines connected to the memory block, applying the verify pass voltage to the unselected word line, and decreasing the voltage of the first source select line group to the second level.

4. The semiconductor memory device of claim 3, wherein the voltage of the second source select line group is maintained at the second level.

5. The semiconductor memory device of claim 4, wherein the first level is a voltage for turning on source select transistors connected to the first source select line group, and the second level is a ground voltage.

6. The semiconductor memory device of claim 2, wherein the control logic controls the peripheral circuit to apply a precharge voltage to a common source line connected to the memory block, and to increase the voltage of the first source select line group to the first level.

7. The semiconductor memory device of claim 6, wherein the control logic controls the peripheral circuit to decrease the voltage of the first source select line group to the second level after increasing the voltage of the first source select line group to the first level.

8. The semiconductor memory device of claim 7, wherein the control logic controls the peripheral circuit to maintain a voltage of the second source select line group different from the first source select line group, while applying the precharge voltage to the common source line connected to the memory block, increasing the voltage of the first source select line group to the first level, and decreasing the voltage of the first source select line group to the second level.

9. The semiconductor memory device of claim 8, wherein the memory block includes first to fourth string groups, the selected string group corresponds to the first string group, the first source select line group includes the first and second source select lines connected to the first and second string groups, respectively, and the second source select line group includes third and fourth source select lines connected to the third and fourth string groups, respectively.

10. The semiconductor memory device of claim 9,
    wherein the first string group includes a first plurality of cell strings that share a first drain select line or the first source select line,
    wherein the second string group includes a second plurality of cell strings that share a second drain select line or the second source select line,
    wherein the third string group includes a third plurality of cell strings that share a third drain select line or a third source select line, and
    wherein the fourth string group includes a fourth plurality of cell strings that share a fourth drain select line or a fourth source select line.

11. The semiconductor memory device of claim 1, wherein the control logic controls the peripheral circuit to apply a precharge voltage to a common source line connected to the memory block, after applying the verify voltage to the selected word line among the word lines connected to the memory block and applying the verify pass voltage to the unselected word line.

12. The semiconductor memory device of claim 11, wherein the control logic controls the peripheral circuit to decrease the voltage of the first source select line group to a second level after applying the precharge voltage to the common source line.

13. The semiconductor memory device of claim 1, wherein source select lines belonging to the first source select line group are electrically connected to each other.

14. The semiconductor memory device of claim 3, wherein source select lines belonging to the second source select line group are electrically connected to each other.

15. A method of operating a semiconductor memory device performing a program operation on a memory block including first to N-th string groups, wherein N is a natural number greater than or equal to 3,
wherein the program operation includes a plurality of program loops, each of the plurality of program loops includes a precharge phase, a program phase and a verify phase, and
wherein the verify phase comprises increasing voltages of a first source select line and a second source select line to a first level, the first source select line being connected to the first string group selected as a program target among the first to N-th string groups, and the second source select line being connected to the second string group that is not selected as the program target among the first to N-th string groups.

16. The method of claim 15, wherein the verify phase further comprises applying a verify voltage to a selected word line among word lines connected to the memory block and applying a verify pass voltage to an unselected word line.

17. The method of claim 15, wherein the verify phase further comprises decreasing the voltages of the first and second source select lines to a second level.

18. The method of claim 17, wherein the first level is a voltage capable of turning on source select transistors included in the first string group and the second string group, the second level is a ground voltage, and during the verify phase, voltages of a third source select line and a fourth source select line are maintained at the second level, the third source select line being connected to the third string group among the first to N-th string groups, and the fourth source select line being connected to the fourth string group among the first to N-th string groups.

19. The method of claim 18, wherein the precharge phase comprises:
applying a precharge voltage to a common source line connected to the memory block; and
increasing the voltages of the first and second source select lines to the first level.

20. The method of claim 19, wherein the voltages of the third and fourth source select lines are maintained at the second level during the precharge phase.

21. The method of claim 15, wherein the precharge phase comprises:
applying a precharge voltage to a common source line connected to the memory block; and
decreasing the voltages of the first and second source select lines to a second level.

22. The method of claim 18, wherein the first source select line and the second source select line are electrically connected to each other, and the third source select line and the fourth source select line are electrically connected to each other.

* * * * *